United States Patent
Yasumatsu

(10) Patent No.: US 9,422,619 B2
(45) Date of Patent: Aug. 23, 2016

(54) PROCESSING APPARATUS AND SHIELD

(71) Applicant: CANON ANELVA CORPORATION, Kawasaki-shi (JP)

(72) Inventor: Yasushi Yasumatsu, Inagi (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 253 days.

(21) Appl. No.: 14/296,505

(22) Filed: Jun. 5, 2014

(65) Prior Publication Data

US 2014/0283743 A1 Sep. 25, 2014

Related U.S. Application Data

(63) Continuation of application No. PCT/JP2012/006742, filed on Oct. 22, 2012.

(30) Foreign Application Priority Data

Dec. 15, 2011 (JP) ................. 2011-275073

(51) Int. Cl.
*C23C 14/04* (2006.01)
*C23C 16/04* (2006.01)
*C23C 14/34* (2006.01)
(Continued)

(52) U.S. Cl.
CPC .............. *C23C 14/042* (2013.01); *C23C 14/22* (2013.01); *C23C 14/3407* (2013.01); *C23C 14/50* (2013.01); *C23C 16/042* (2013.01); *H01J 37/32651* (2013.01); *H01J 37/3411* (2013.01); *H01J 37/3441* (2013.01)

(58) Field of Classification Search
None
See application file for complete search history.

(56) References Cited

U.S. PATENT DOCUMENTS

| 2004/0168631 A1 | 9/2004 | Honjou et al. |
| 2005/0185359 A1* | 8/2005 | Wickramanayaka H01L 21/68721 361/234 |

(Continued)

FOREIGN PATENT DOCUMENTS

| CN | 1511972 A | 7/2004 |
| CN | 101779241 A | 7/2010 |

(Continued)

OTHER PUBLICATIONS

International Search Report (PCT/ISA/210) mailed on Nov. 13, 2012, by the Japanese Patent Office as the International Searching Authority for International Application No. PCT/JP2012/006742.

(Continued)

*Primary Examiner* — Dah-Wei D Yuan
*Assistant Examiner* — Jethro M Pence
(74) *Attorney, Agent, or Firm* — Buchanan Ingersoll & Rooney PC

(57) ABSTRACT

A processing apparatus includes a substrate holding portion, a shield arranged to surround a substrate, and a shield holding portion configured to hold the shield. The shield includes first magnets each having a magnetic pole of a first polarity facing the shield holding portion, and second magnets each having a magnetic pole of a second polarity facing the shield holding portion. The first magnets and the second magnets are arranged at positions symmetrical with respect to the center of the shield. The shield holding portion includes third magnets each having a magnetic pole of the first polarity facing the shield, and fourth magnets each having a magnetic pole of the second polarity facing the shield.

4 Claims, 8 Drawing Sheets

(51) Int. Cl.
  *H01J 37/34* (2006.01)
  *H01J 37/32* (2006.01)
  *C23C 14/22* (2006.01)
  *C23C 14/50* (2006.01)

(56) References Cited

U.S. PATENT DOCUMENTS

2009/0304931 A1  12/2009  Uenosono
2009/0308317 A1  12/2009  Sone et al.
2010/0206222 A1*  8/2010  Sung .................... C23C 16/042
                                              118/69

FOREIGN PATENT DOCUMENTS

| JP | 3-6365 A | 1/1991 |
|---|---|---|
| JP | 4-311568 A | 11/1992 |
| JP | 6-196476 A | 7/1994 |
| JP | 2003-183810 A | 7/2003 |
| JP | 2004-214624 A | 7/2004 |
| JP | 2009-293074 A | 12/2009 |
| WO | WO 2009/153856 A1 | 12/2009 |

OTHER PUBLICATIONS

Written Opinion (PCT/ISA/237) mailed on Nov. 13, 2012, by the Japanese Patent Office as the International Searching Authority for International Application No. PCT/JP2012/006742.

Office Action issued on Apr. 16, 2015, by the Chinese Patent Office in corresponding Chinese Patent Application No. 201280061498.1. (5 pages).

* cited by examiner

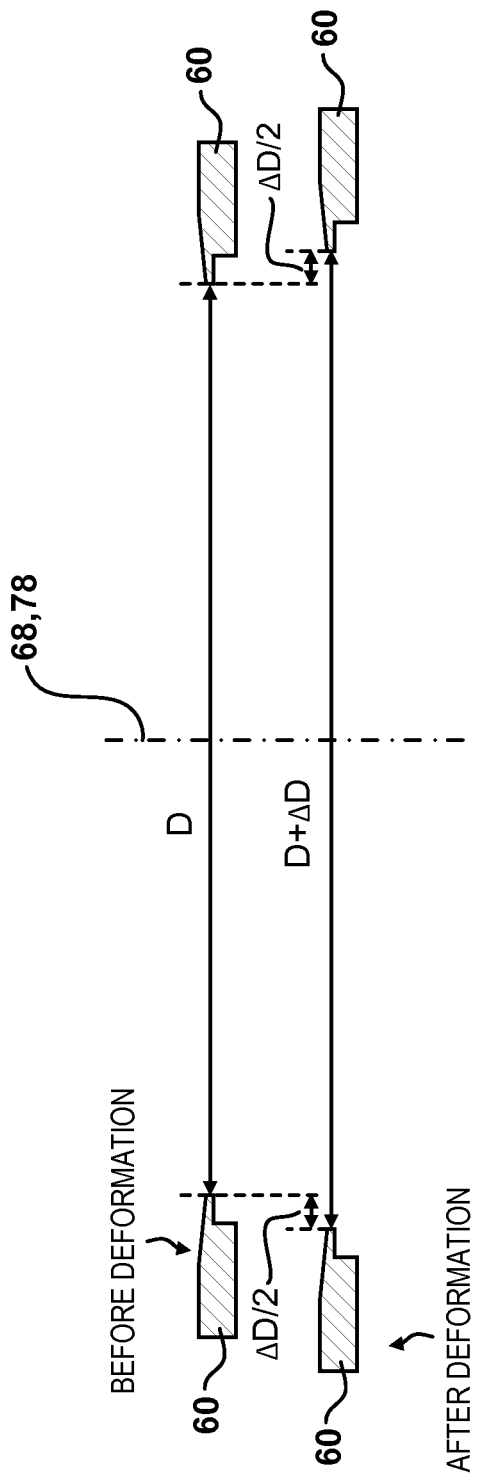

PROCESSING APPARATUS AND SHIELD

This application is a continuation of International Patent Application No. PCT/JP2012/006742 filed on Oct. 22, 2012 and claims priority to Japanese Patent Application No. 2011-275073 filed on Dec. 15, 2011, the entire content of both of which is incorporated herein by reference.

TECHNICAL FIELD

The present invention relates to a processing apparatus and a shield that can be built in the processing apparatus

BACKGROUND ART

In a sputtering apparatus, a shield (protecting plate) can be arranged so as to surround a substrate or target. The shield can be fixed to a shield holding portion by, for example, bolts or the like. PTL 1 discloses an apparatus that arranges a protecting plate to surround a sputtering evaporation source. In this apparatus, the protecting plate is attached to a flange by bolts.

CITATION LIST

Patent Literature

PTL 1: Japanese Patent Laid-Open No. 4-311568

SUMMARY OF INVENTION

Technical Problem

In the processing apparatus such as a sputtering apparatus, the shield can expand when heated during processing of a substrate. In recent years, to improve the production efficiency, a film is formed up to a region near the edge of a substrate so that the region near the edge of the substrate can also be used as a device. For this reason, the distance between the substrate and the shield arranged to surround the substrate tends to be short. Under these circumstances, when the shield is deformed by heat, the positional relationship between the substrate and the shield may change, and manufacturing errors may occur. Especially in a configuration in which, for example, a shield is fixed at one portion, and another portion is allowed to freely move to permit deformation of the shield by heat, the other portion may cover a region on a substrate, which should be used as a device, resulting in deposition errors.

The present invention has been made in consideration of the above problem, and has as its object to provide a technique advantageous in improving the tolerance for deformation of a shield surrounding a substrate.

Solution to Problem

According to a first aspect of the present invention, there is provided a processing apparatus comprising a substrate holding portion, a shield arranged so as to surround a substrate when the substrate holding portion holds the substrate, and a shield holding portion configured to hold the shield by a magnetic force, wherein the shield includes a plurality of first magnets each having a magnetic pole of a first polarity facing the shield holding portion, and a plurality of second magnets each having a magnetic pole of a second polarity facing the shield holding portion, the plurality of first magnets and the plurality of second magnets being arranged at positions symmetrical with respect to a center of the shield, the shield holding portion includes a plurality of third magnets each having a magnetic pole of the first polarity facing the shield so as to generate an attraction force with respect to a corresponding one of the plurality of second magnets, and a plurality of fourth magnets each having a magnetic pole of the second polarity facing the shield so as to generate the attraction force with respect to a corresponding one of the plurality of first magnets, the plurality of third magnets and the plurality of fourth magnets being arranged at positions symmetrical with respect to the center of the shield holding portion, and the shield holding portion holds the shield so as to allow deformation of the shield by heat, and a center of the shield is located at the center of the shield holding portion by the magnetic forces acting between the plurality of first magnets and the plurality of fourth magnets and the magnetic forces acting between the plurality of second magnets and the plurality of third magnets.

According to a second aspect of the present invention, there is provided a shield held by a shield holding portion in a processing apparatus, comprising a plurality of first magnets each having a magnetic pole of a first polarity facing the shield holding portion, and a plurality of second magnets each having a magnetic pole of a second polarity facing the shield holding portion to fix the shield to the shield holding portion by a magnetic force, wherein the plurality of first magnets and the plurality of second magnets are arranged at positions symmetrical with respect to a center of the shield.

Advantageous Effects of Invention

According to the present invention, there is provided a technique advantageous in improving the tolerance for deformation of a shield surrounding a substrate.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 8 is a view schematically showing the effect of the embodiment of the present invention.

DESCRIPTION OF EMBODIMENTS

An embodiment of the present invention will now be described with reference to the accompanying drawings.

Figure 1:
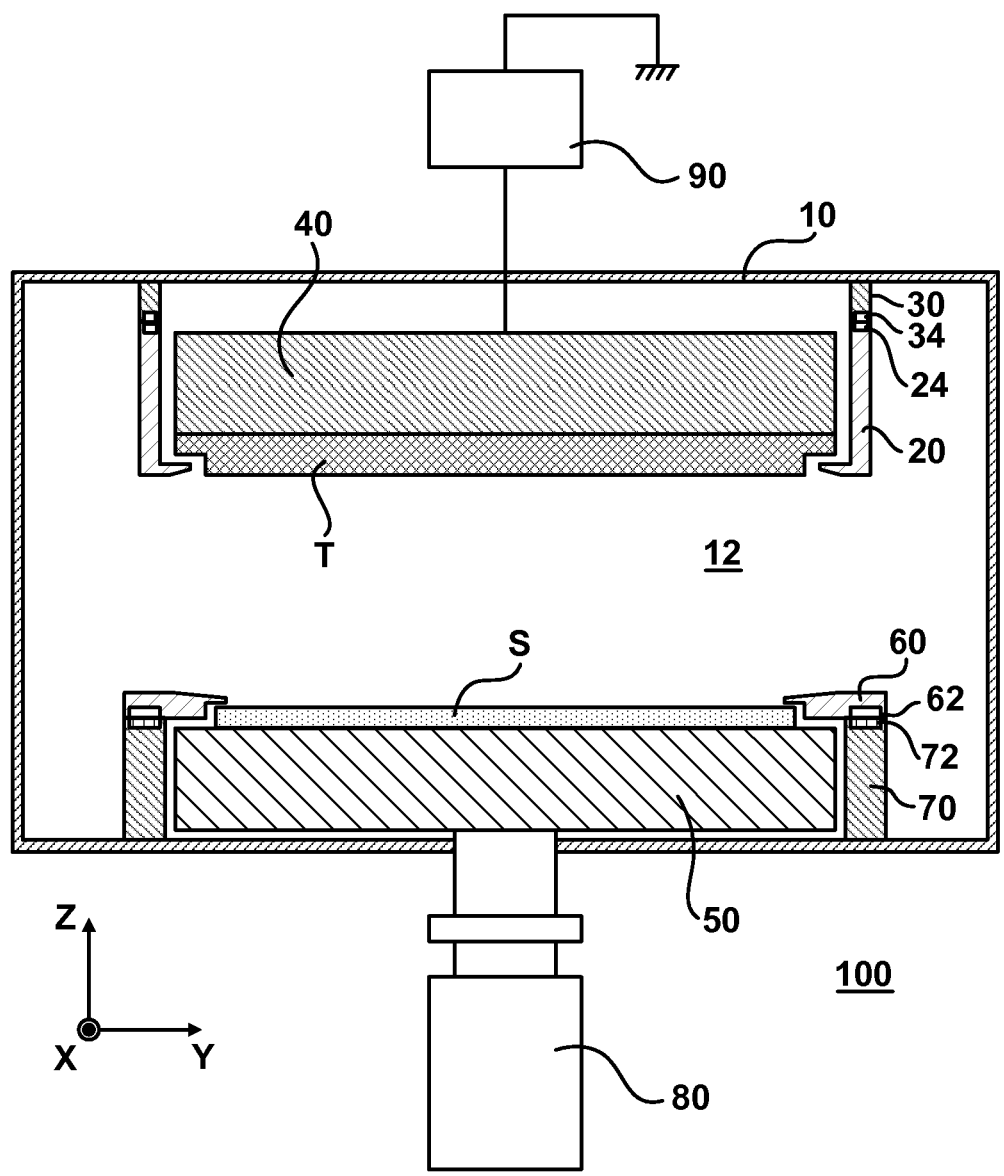
FIG. 1 is a view showing the schematic arrangement of a processing apparatus according to an embodiment of the present invention.

FIG. 1 shows the schematic arrangement of a processing apparatus 100 according to the embodiment of the present invention. The processing apparatus 100 can be configured to process a substrate S in a vacuum processing space 12 in a chamber 10. The processing apparatus 100 can be formed as, for example, a sputtering apparatus, a CVD apparatus, a plasma processing apparatus, or the like. To give a more specific example, the processing apparatus 100 formed as a sputtering apparatus will be explained below. However, this is not intended to limit the scope of the present invention.

The processing apparatus 100 includes shields 20 and 60 arranged in the chamber 10, and shield holding portions 30 and 70 that hold the shields 20 and 60, respectively, by a magnetic force. The shield 20 can be arranged to surround a target T. The shield 60 can be arranged to surround the substrate S.

The shield holding portion 30 has a holding surface on which a magnet 34 is arranged. The shield 20 has an end face on which a magnet 24 is arranged. The shield 20 can be fixed to the shield holding portion 30 by a magnetic force that acts between the magnets 34 and 24. The target T can be fixed to a backing plate 40. The backing plate 40 is cooled by a cooling unit (not shown). This can cool the target T. The backing plate 40 can also function as an electrode to which a voltage is applied from a power supply 90. The shield 20 can be arranged so as to surround the target T typically and the backing plate 40 as well wholly or partially.

The substrate S can be held by a substrate holding portion 50. The substrate holding portion 50 can be rotatably driven by a driving unit 80. In this embodiment, the processing apparatus 100 is formed as a sputtering apparatus, and a film is formed on the substrate S by sputtering. More specifically, ions generated by discharge caused by a voltage applied between the substrate holding portion 50 holding the substrate S and the backing plate 40 collide against the target T, and the target T emits particles. When the particles are deposited on the substrate S, a film is formed on the substrate S.

The shield holding portion 70 has a holding surface on which a magnet 72 is arranged. The shield 60 has an end face on which a magnet 62 is arranged. The shield 60 can be fixed to the shield holding portion 70 by a magnetic force that acts between the magnets 72 and 62. The shield 60 can be configured to define a region where a film is to be formed out of the surface of the substrate S. More specifically, the shield 60 can be configured to cover a region near the edge out of the surface of the substrate S. The shield holding portion 70 locates the center of the shield 60 at the center of the shield holding portion 70 independent of deformation of the shield 60 while holding the shield 60 so as to allow deformation of the shield 60 by heat.

Particles from the target 5 can be deposited and form a deposit on the shields 20 and 60 as well as the substrate S. Before the deposit exceeds the allowable level, the shields 20 and 60 are detached from the shield holding portions 30 and 70, and the new shields 20 and 60 or cleaned shields 20 and 60 are attached to the shield holding portions 30 and 70, respectively. The processing space 12 can be exhausted and depressurized by an exhaust device such as a turbo molecular pump (not shown). A sputter gas (for example, argon) can be introduced into the processing space 12 via a gas supply portion (not shown). The processing apparatus 100 can include a magnet that provides a magnetic field around the target T, and can be formed as a magnetron sputtering apparatus. The magnet can be arranged such that the backing plate 40 is sandwiched between the magnet and the target T.

Figure 2:
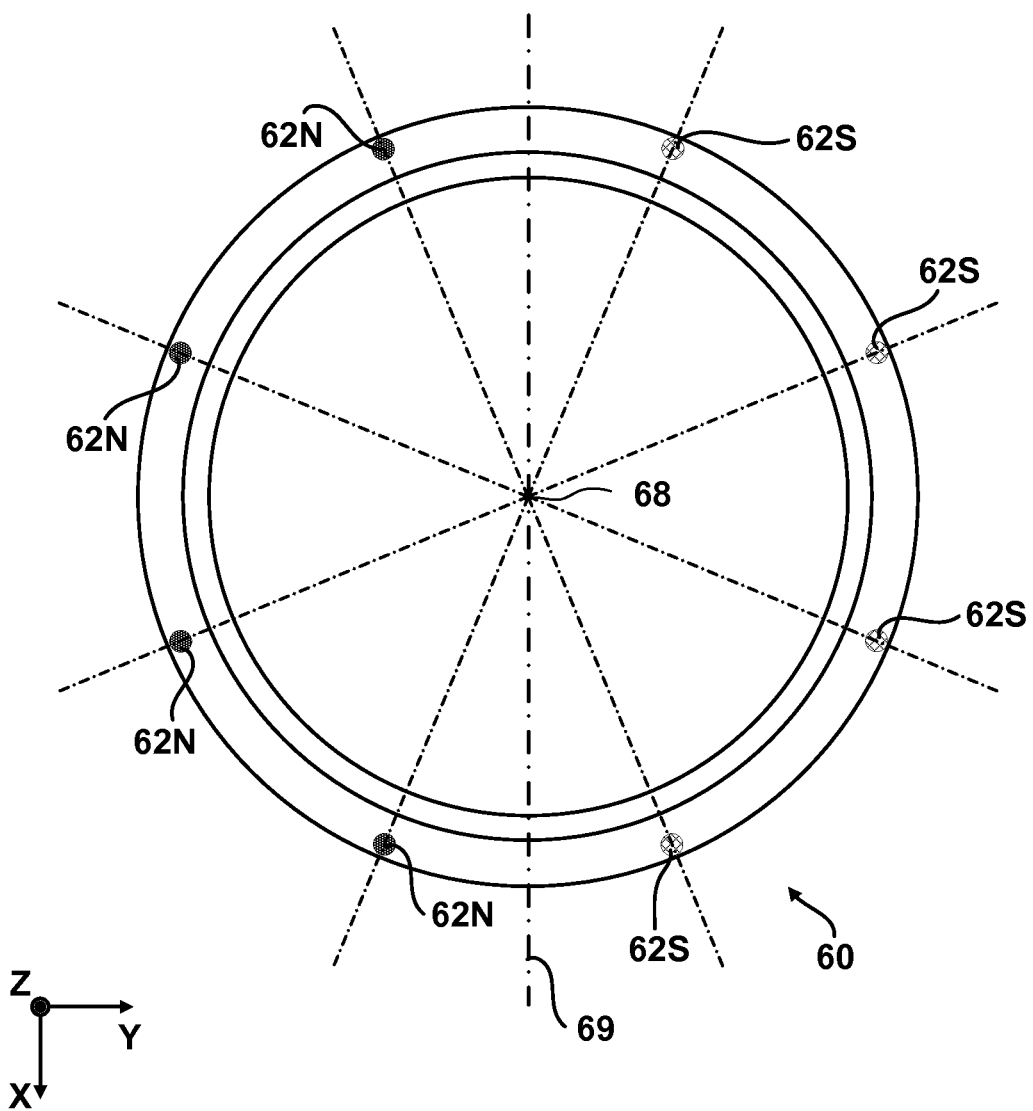
FIG. 2 is a view of a shield surrounding a substrate, which is viewed from the side of a target.

FIG. 2 is a view of the shield 60 surrounding the substrate S, which is viewed from the side of the target T. As illustrated in FIG. 2, the shield 60 surrounding the substrate S includes a plurality of first magnets 62N each having a magnetic pole (for example, N pole) of the first polarity facing the shield holding portion 70, and a plurality of second magnets 62S each having a magnetic pole (for example, S pole) of the second polarity facing the shield holding portion 70. Note that since FIG. 2 is a view of the shield 60 surrounding the substrate S, which is viewed from the side of the target T, the shield 60 hides the plurality of first magnets 62N and the plurality of second magnets 62S in fact. The plurality of first magnets 62N and the plurality of second magnets 62S are arranged at positions symmetrical with respect to a center 68 of the shield 60. When the substrate S is circular, the shield 60 can have a ring shape. When the substrate S is rectangular, the shield 60 can have a rectangular shape.

Figure 3:
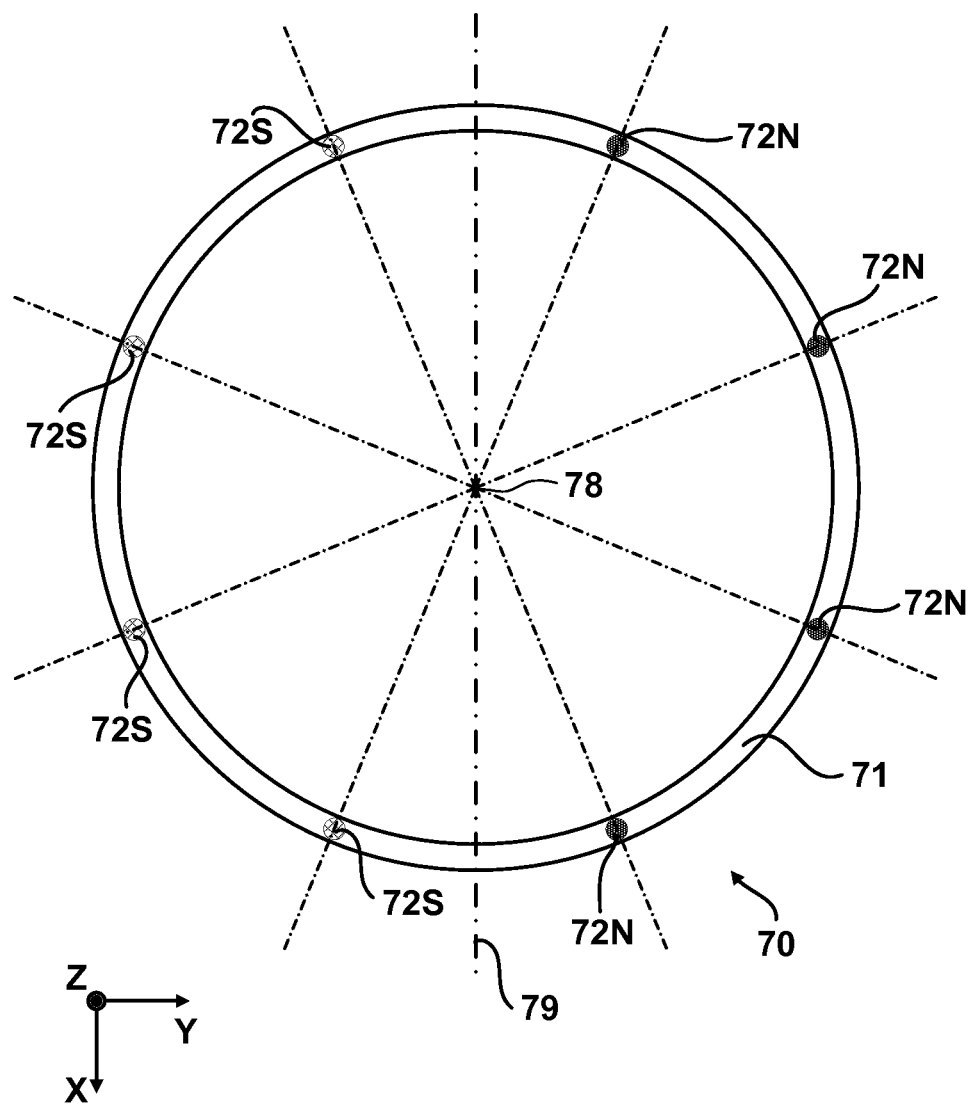
FIG. 3 is a view of a shield holding portion that holds the shield surrounding a substrate, which is viewed from the side of a target T.

FIG. 3 is a view of the shield holding portion 70 that holds the shield 60 surrounding the substrate S, which is viewed from the side of the target T. As illustrated in FIG. 3, the shield holding portion 70 that holds the shield 60 surrounding the substrate S includes a plurality of third magnets 72N each having a magnetic pole (for example, N pole) of the first polarity facing the shield 60 so as to generate an attraction force with respect to a corresponding one of the plurality of second magnets 62S of the shield 60, and a plurality of fourth magnets 72S each having a magnetic pole (for example, S pole) of the second polarity facing the shield 60 so as to generate an attraction force with respect to a corresponding one of the plurality of first magnets 62N of the shield 60. The plurality of third magnets 72N and the plurality of fourth magnets 72S are arranged at positions symmetrical with respect to a center 78 of the shield holding portion 70.

Figure 4:
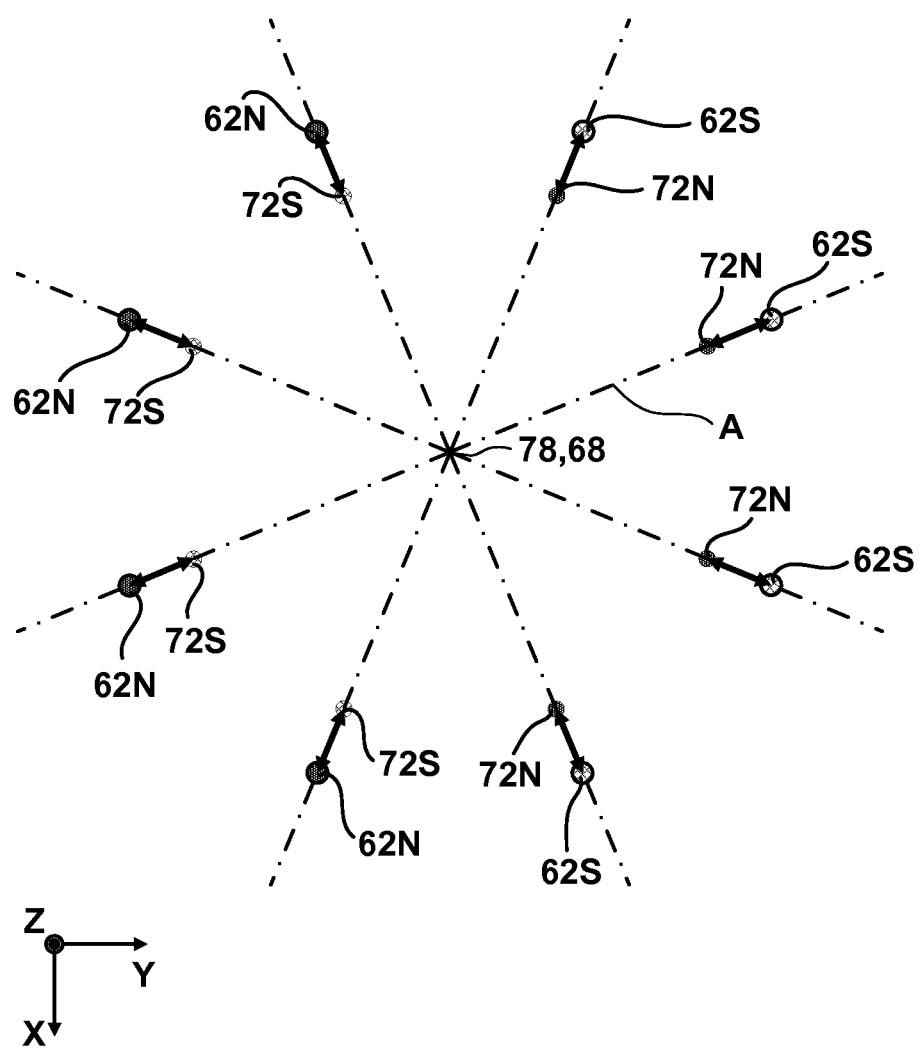
FIG. 4 is a view schematically showing an example of the positional relationship between magnets on the shield side and magnets on the shield holding portion side in a state in which the shield is held by the shield holding portion.
Figure 5:
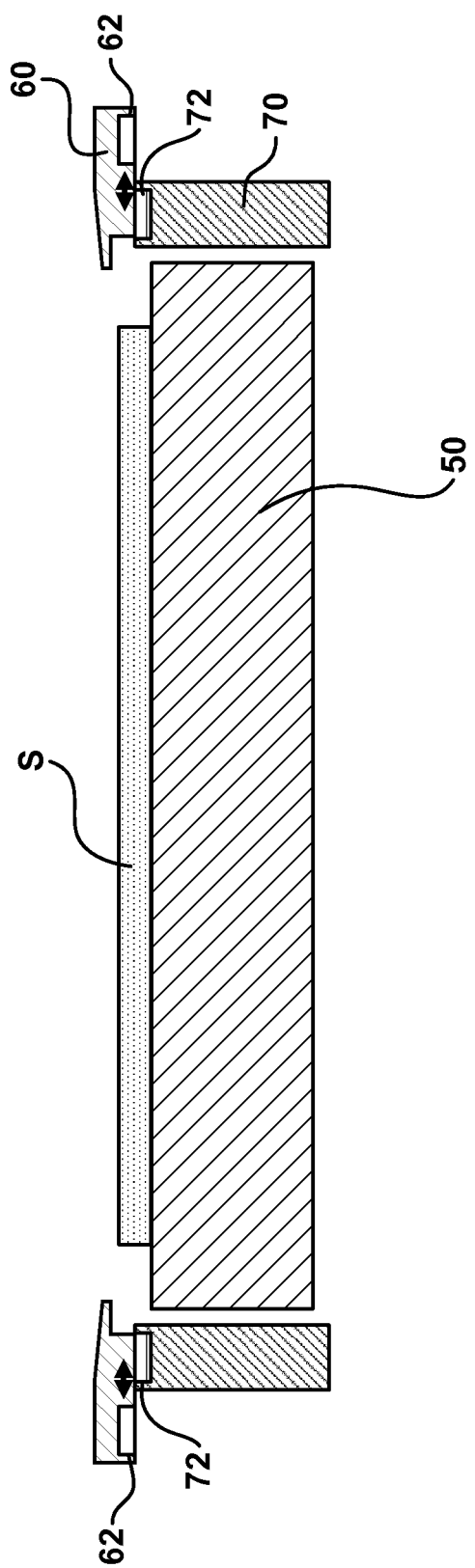
FIG. 5 is a view schematically showing the sections of the shield and the shield holding portion taken along a line A in FIG. 4.

FIG. 4 is a plan view schematically showing an example of the positional relationship between the plurality of first magnets 62N and the plurality of second magnets 62S of the shield 60 and the plurality of third magnets 72N and the plurality of fourth magnets 72S of the shield holding portion 70 in a state in which the shield 60 is held by the shield holding portion 70. FIG. 5 is a view schematically showing the sections of the shield 60 and the shield holding portion 70 taken along a line A in FIG. 4. Each arrow in FIGS. 4 and 5 schematically indicates an attraction force acting between the magnets. In the example shown in FIGS. 4 and 5, the plurality of first magnets 62N and the plurality of second magnets 62S of the shield 60 are arranged, on the plan view, outside the plurality of third magnets 72N and the plurality of fourth magnets 72S of the shield holding portion 70.

Figure 6:
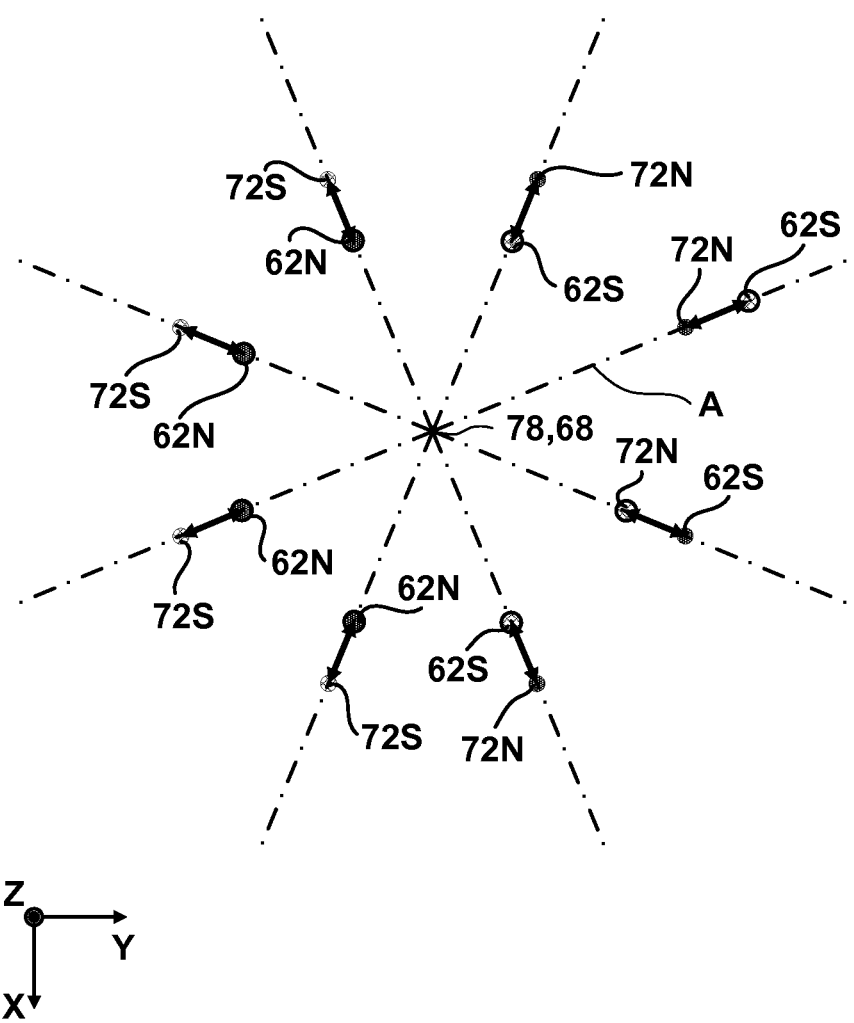
FIG. 6 is a view schematically showing another example of the positional relationship between the magnets on the shield side and the magnets on the shield holding portion side in the state in which the shield is held by the shield holding portion.
Figure 7:
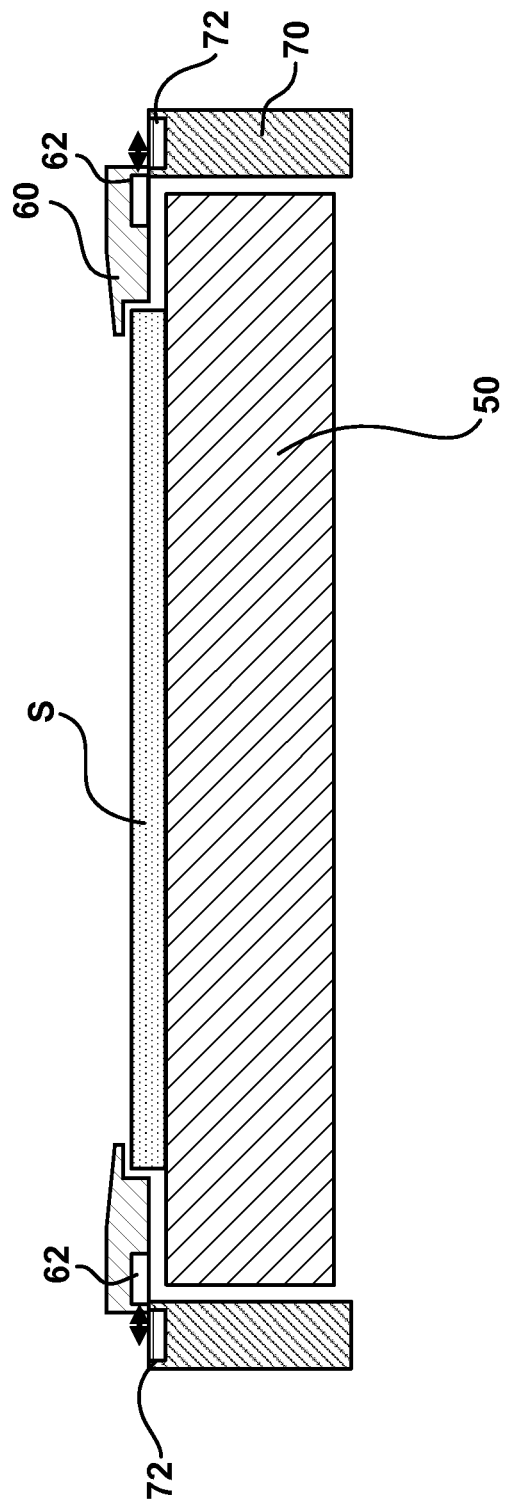
FIG. 7 is a view schematically showing the sections of the shield and the shield holding portion taken along a line A in FIG. 6.

FIG. 6 is a plan view schematically showing another example of the positional relationship between the plurality of first magnets 62N and the plurality of second magnets 62S of the shield 60 and the plurality of third magnets 72N and the plurality of fourth magnets 72S of the shield holding portion 70 in a state in which the shield 60 is held by the shield holding portion 70. FIG. 7 is a view schematically showing the sections of the shield 60 and the shield holding portion 70 taken along a line A in FIG. 6. Each arrow in FIGS. 6 and 7 schematically indicates an attraction force acting between the magnets. In the example shown in FIGS. 6 an 7, the plurality of first magnets 62N and the plurality of second magnets 62S of the shield 60 are arranged, on the plan view, inside the plurality of third magnets 72N and the plurality of fourth magnets 72S of the shield holding portion 70.

In this embodiment, the shield 60 is placed on the shield holding portion 70, and the shield holding portion 70 holds the shield 60 by a magnetic force. Hence, the shield 60 held by the shield holding portion 70 has degrees of freedom for deformation. In other words, the shield holding portion 70 holds the shield 60 so as to allow deformation of the shield 60 by heat. In addition, the shield 60 is configured such that the center 68 of the shield 60 is located at the center 78 of the shield holding portion 70 by magnetic forces acting between the plurality of first magnets 62N of the shield 60 and the plurality of fourth magnets 72S of the shield holding portion 70 and magnetic forces acting between the plurality of second magnets 62S of the shield 60 and the plurality of third magnets 72N of the shield holding portion 70.

According to the above configuration that locates the center 68 of the shield 60 at the center 78 of the shield holding portion 70, for example, even when an inner diameter D of the shield 60 changes by ΔD due to heat, the moving amount of the shield 60 at a portion facing a region near the edge of the substrate S is ΔD/2 at maximum, as schematically shown in FIG. 8. Hence, the tolerance for deformation of the shield 60 improves.

The plurality of first magnets 62N of the shield 60 can be arranged at an equal interval, and the plurality of second magnets 62S of the shield 60 can also be arranged at an equal interval. Similarly, the plurality of third magnets 72N of the shield holding portion 70 can be arranged at an equal interval, and the plurality of fourth magnets 72S of the shield holding portion 70 can also be arranged at an equal interval. This arrangement is advantageous for circumferentially uniforming the forces that act to locate the center 68 of the shield 60 at the center 78 of the shield holding portion 70.

The plurality of first magnets 62N of the shield 60 can be arranged on one side of a line 69 passing through the center 68 of the shield 60, and the plurality of second magnets 62S of the shield 60 can be arranged on the other side of the line 69. The plurality of third magnets 72N of the shield holding portion 70 can be arranged so as to face the plurality of second magnets 62S of the shield 60, respectively. The plurality of fourth magnets 72S of the shield holding portion 70 can be arranged so as to face the plurality of first magnets 62N of the shield 60, respectively. That is, as in the shield 60, the plurality of third magnets 72N of the shield holding portion 70 can be arranged on one side of a line 79 passing through the center 78 of the shield 60, and the plurality of fourth magnets 72S of the shield holding portion 70 can be arranged on the other side of the line 79. According to this arrangement, the attachment direction of the shield 20 to the shield holding portion 30 is uniquely determined. It is therefore possible to prevent an error in the attachment direction of the shield 20.

The present invention is not limited to the above embodiment and various changes and modifications can be made within the spirit and scope of the present invention. Therefore, to apprise the public of the scope of the present invention, the following claims are made.

The invention claimed is:

1. A processing apparatus comprising: a substrate holding portion; a shield arranged so as to surround a substrate when the substrate holding portion holds the substrate; and a shield holding portion configured to hold the shield by a magnetic force, wherein the shield includes a plurality of first magnets each having a magnetic pole of a first polarity facing the shield holding portion, and a plurality of second magnets each having a magnetic pole of a second polarity facing the shield holding portion, the plurality of first magnets and the plurality of second magnets being arranged at positions symmetrical with respect to a center of the shield, the shield holding portion includes a plurality of third magnets each having a magnetic pole of first polarity facing the shield so as to generate an attraction force with respect to a corresponding one of the plurality of second magnets, and a plurality of fourth magnets each having a magnetic pole of the second polarity facing the shield so as to generate the attraction force with respect to a corresponding one of the plurality of first magnets, the plurality of third magnets and the plurality of fourth magnets being arranged at positions symmetrical with respect to the center of the shield holding portion, and the shield holding portion holds the shield so as to allow deformation of the shield by heat, and a center of the shield is located at the center of the shield holding portion by the magnetic forces acting between the plurality of first magnets and the plurality of fourth magnets and the magnetic forces acting between the plurality of second magnets and the plurality of third magnets.

2. The processing apparatus according to claim 1, wherein the shield is placed on the shield holding portion.

3. The processing apparatus according to claim 1, wherein the plurality of first magnets are arranged at an equal interval, the plurality of second magnets are arranged at the equal interval, the plurality of third magnets are arranged at the equal interval, and the plurality of fourth magnets are arranged at the equal interval.

4. The processing apparatus according to claim 1, wherein the plurality of first magnets are arranged on one side of a line passing through the center of the shield, and the plurality of second magnets are arranged on the other side of the line, and the plurality of third magnets are arranged so as to face the plurality of second magnets, respectively, and the plurality of fourth magnets are arranged so as to face the plurality of first magnets, respectively.

\* \* \* \* \*